United States Patent [19]
Manning

[11] Patent Number: 5,729,503
[45] Date of Patent: Mar. 17, 1998

[54] ADDRESS TRANSITION DETECTION ON A SYNCHRONOUS DESIGN

[75] Inventor: Troy A. Manning, Boise, Id.

[73] Assignee: Micron Technology, Inc., Boise, Id.

[21] Appl. No.: 506,438

[22] Filed: Jul. 24, 1995

Related U.S. Application Data

[63] Continuation-in-part of Ser. No. 386,894, Feb. 10, 1995, Pat. No. 5,610,864, which is a continuation-in-part of Ser. No. 370,761, Dec. 23, 1994, Pat. No. 5,526,320.

[51] Int. Cl.$^6$ ............................................. G11C 8/00
[52] U.S. Cl. ........................... 365/233.5; 365/189.05; 365/202; 365/230.08
[58] Field of Search ........................ 365/233.5, 230.08, 365/189.05, 202

[56] References Cited

U.S. PATENT DOCUMENTS

| | | | |
|---|---|---|---|
| 4,344,156 | 8/1982 | Eaton, Jr. et al. | 365/203 |
| 4,355,377 | 10/1982 | Sud et al. | 365/203 |
| 4,484,308 | 11/1984 | Lewandowski et al. | 364/900 |
| 4,562,555 | 12/1985 | Ouchi et al. | 365/233 |

(List continued on next page.)

FOREIGN PATENT DOCUMENTS 19507562  9/1995  Germany.

OTHER PUBLICATIONS

"DRAM 1 Meg×4 DRAM 5VEDO Page Mode", *1995 DRAM Data Book*, pp. 1-1 thru 1-30, (Micron Technology, I).

"Rossini, Pentium, PCI-ISA, Chip Set", *Symphony Laboratories*, entire book.

"4DRAM 1991", *Toshiba America Electronic Components, Inc.*, pp. A-137-A-159.

(List continued on next page.)

*Primary Examiner*—Do Hyun Yoo
*Attorney, Agent, or Firm*—Schwegman, Lundberg, Woessner & Kluth, P.A.

[57] ABSTRACT

An integrated circuit memory device is designed to perform high speed burst access read and write cycles. An address strobe signal is used to latch a first address. During a burst access cycle the address is incremented internal to the device with additional address strobe transitions. A new memory address is only required at the beginning of each burst access. Read/Write commands are issued once per burst access eliminating the need to toggle the Read/Write control line at the device cycle frequency. A transition of the Read/Write control line during a burst access is used to terminate the burst access and initialize the device for another burst access. The memory device maintains compatibility with nonburst mode devices such as Extended Data Out (EDO) and Fast Page Mode through bond option or mode selection circuitry. A multiplexer selects between the input address and the burst address generator output to feed an asynchronous address transition detection circuit. The address transition detection circuit generates an equilibration control signal between memory access cycles.

8 Claims, 7 Drawing Sheets

U.S. PATENT DOCUMENTS

| | | | |
|---|---|---|---|
| 4,567,579 | 1/1986 | Patel et al. | 365/189 |
| 4,575,825 | 3/1986 | Ozaki et al. | 365/189 |
| 4,603,403 | 7/1986 | Toda | 365/189 |
| 4,618,947 | 10/1986 | Tran et al. | 365/230 |
| 4,649,522 | 3/1987 | Kirsch | 365/189 |
| 4,685,089 | 8/1987 | Patel et al. | 365/233 |
| 4,707,811 | 11/1987 | Takemae et al. | 365/239 |
| 4,788,667 | 11/1988 | Nakano et al. | 365/193 |
| 4,870,622 | 9/1989 | Aria et al. | 365/230.02 |
| 4,875,192 | 10/1989 | Matsumoto | 365/193 |
| 5,058,066 | 10/1991 | Yu | 365/189.05 |
| 5,126,975 | 6/1992 | Handy et al. | 365/230.01 |
| 5,267,200 | 11/1993 | Tobita | 365/189.05 |
| 5,268,865 | 12/1993 | Takasugi | 365/189.05 |
| 5,280,594 | 1/1994 | Young et al. | 395/425 |
| 5,305,284 | 4/1994 | Iwase | 365/238.5 |
| 5,325,330 | 6/1994 | Morgan | 365/189.05 |
| 5,325,502 | 6/1994 | McLaury | 395/425 |
| 5,349,566 | 9/1994 | Merritt et al. | 365/233.5 |
| 5,357,469 | 10/1994 | Sommer et al. | 365/193 |
| 5,373,227 | 12/1994 | Keeth | 323/313 |
| 5,379,261 | 1/1995 | Jones, Jr. | 365/230.01 |
| 5,392,239 | 2/1995 | Margulis et al. | 365/189.01 |
| 5,410,670 | 4/1995 | Hansen et al. | 395/425 |
| 5,452,261 | 9/1995 | Chung et al. | 365/233 |
| 5,457,659 | 10/1995 | Schaefer | 365/222 |
| 5,526,320 | 6/1996 | Zagar et al. | 365/233.5 |
| 5,598,376 | 1/1997 | Merritt et al. | 365/230.06 |
| 5,610,864 | 3/1997 | Manning | 365/189.05 X |
| 5,640,364 | 6/1997 | Merritt et al. | 365/233.5 |
| 5,652,724 | 7/1997 | Manning | 365/233 X |
| 5,661,695 | 8/1997 | Zagar et al. | 365/233.5 |
| 5,668,773 | 9/1997 | Zagar et al. | 365/233 |

OTHER PUBLICATIONS

"Application Specific DRAM", *Toshiba America Electronic Components, Inc.*, C178, C–260, C 218, (1994).

"Burst DRAM Function & Pinout", *Oki Electric Ind., Co., Ltd., 2nd Presentation, Item # 619*, (Sep. 1994).

"Hyper Page Mode DRAM", *8026 Electronic Engineering*, 66, No. 813, Woolwich, London, GB, pp. 47–48, (Sep. 1994).

"Mosel–Vitelic V53C8257H DRAM Specification Sheet, 20 pages, Jul. 2, 1994".

"Pipelined Burst DRAM", *Toshiba, JEDEC JC 42.3 Hawaii*, (Dec. 1994).

"Samsung Synchronous DRAM", *Samsung Electronics*, pp. 1–16, (Mar. 1993).

"Synchronous DRAM 2 MEG×8 SDRAM", *Micron Semiconductor, Inc.*, pp. 2–43 through 2–8.

Dave Bursky, "Novel I/O Options and Innovative Architectures Let DRAMs Achieve SRAM Performance; Fast DRAMS can be swapped for SRAM Caches", *Electronic Design*, vol. 41, No. 15, Cleveland, Ohio, pp. 55–67, (Jul. 22, 1993).

Shiva P. Gowni, et al., "A 9NS, 32K×9, BICMOS TTL Synchronous Cache RAM With Burst Mode Access", *IEEE, Custom Integrated Circuits Conference*, pp. 781–786, (Mar. 3, 1992).

ADDRESS TRANSITION DETECTION ON A SYNCHRONOUS DESIGN

CROSS REFERENCE TO RELATED APPLICATIONS

This application is a continuation in part of application Ser. No. 08/386,894 filed Feb. 10, 1995, now U.S. Pat. No. 5,610,864 which is a continuation in part of application Ser. No. 08/370,761 filed Dec. 23, 1994 now U.S. Pat. No. 5,526,320.

FIELD OF THE INVENTION

This invention relates to memory device architectures designed to provide high density data storage with high speed read and write access cycles. This invention relates more specifically to equilibration of data lines between memory access cycles in a device designed to operate in a burst access mode.

BACKGROUND OF THE INVENTION

There is a demand for faster, higher density, random access memory integrated circuits which provide a strategy for integration into today's personal computer systems. In an effort to meet this demand, numerous alternatives to the standard DRAM architecture have been proposed. One method of providing a longer period of time when data is valid at the outputs of a DRAM without increasing the fast page mode cycle time is called Extended Data Out (EDO) mode. In an EDO DRAM the data lines are not tri-stated between read cycles in a fast page mode operation. Instead, data is held valid after /CAS goes high until sometime after the next /CAS low pulse occurs, or until/RAS or the output enable (/OE) goes high. Determining when valid data will arrive at the outputs of a fast page mode or EDO DRAM can be a complex function of when the column address inputs are valid, when /CAS falls, the state of/OE and when /CAS rose in the previous cycle. The period during which data is valid with respect to the control line signals (especially /CAS) is determined by the specific implementation of the EDO mode, as adopted by the various DRAM manufacturers.

Methods to shorten memory access cycles tend to require additional circuitry, additional control pins and nonstandard device pinouts. The proposed industry standard synchronous DRAM (SDRAM) for example has an additional pin for receiving a system clock signal. Since the system clock is connected to each device in a memory system, it is highly loaded, and it is always toggling circuitry in every device. SDRAMs also have a clock enable pin, a chip select pin and a data mask pin. Other signals which appear to be similar in name to those found on standard DRAMs have dramatically different functionality on a SDRAM. The addition of several control pins has required a deviation in device pinout from standard DRAMs which further complicates design efforts to utilize these new devices. Significant amounts of additional circuitry are required in the SDRAM devices which in turn result in higher device manufacturing costs.

It is desirable to design and manufacture a memory device having a standard DRAM pinout and a burst mode of operation where multiple data values can be sequentially written to or read from the device in response to a single address location and multiple access cycle strobes. It is also desirable that this new memory device operate at higher frequencies than standard DRAMs.

In a standard DRAM device, equalization of internal data I/O lines is performed in response to column address transitions in preparation for reading or writing data from another memory cell, and also in response to a receipt of a write command to reduce the maximum signal transition on the data lines once the write drivers are enabled. Since there is a relatively wide time period in which column addresses may become valid, it has been advantageous to use an asynchronous address transition detection circuit to generate an equilibration control signal in response to address transitions. In EDO and fast page mode devices for example, the column address is treated as valid during a page mode cycle while /CAS is high. A read cycle will begin while /CAS is high at the column address indicated by the column address input signals. However, the column address is allowed to change until /CAS falls. Any column address change during the /CAS high time will require a new equilibration of I/O lines and the selection of the new column. When CAS falls, the column address is latched and further transitions are masked. Equilibration of I/O lines allows for faster sensing of read data, and for faster writing of input data. If the data lines are each equalized to one half of Vcc for example, then the write data drivers will only need to drive one line from half Vcc to ground, and the other from half Vcc to Vcc. Otherwise, if the write data is not equal to the data previously on the I/O lines, the write data drivers will need to drive both true and compliment I/O lines a full Vcc swing for each data bit being written. Equalization of the data I/O lines reduces the maximum write cycle time by eliminating the worst case signal swing conditions. A similar situation exists during read cycles. In a read cycle, data sense amplifiers only need to drive an equilibrated I/O line from half Vcc to Vcc or ground. If the I/O lines were not equilibrated, the sense amplifiers would need to be large enough to overcome the full data signals on the I/O lines in a read cycle in a short period of time to allow for fast data access. A simple method of equilibrating the I/O lines is to: disable I/O line drivers; isolate the I/O lines from the digit lines; and couple complimentary I/O lines together. When a true I/O line is coupled to a complimentary I/O line, a logic high will be coupled to a logic low and each line will equalize to a potential approximately half way between a high and a low. It is important to disable the I/O line drivers during equilibration to prevent a true logic driver from being coupled to a complimentary logic driver which will draw excessive current from the logic high source to the logic low source.

In a burst access memory device, each access cycle can begin at a fixed point in time relative to the access cycle strobe or clock signal. In this case, an asynchronous address detection circuit is not required since address changes can be restricted to a fixed point in time relative to the access cycle strobe.

SUMMARY OF THE INVENTION

An integrated circuit memory device with a standard DRAM pinout is designed for high speed data access and for compatibility with existing memory systems. A high speed burst mode of operation is provided where multiple sequential accesses occur following a single column address, and read data is output relative to the /CAS control signal. In the burst mode of operation the address is incremented internal to the device eliminating the need for external address lines to switch at high frequencies. Read/Write commands are issued once per burst access eliminating the need to toggle the Read/Write control line at high speeds. Only one control line per memory chip (/CAS) must toggle at the operating frequency in order to clock the internal address counter and the data input/output latches. The load on each /CAS is typically less than the load on the other control signals (/RAS, /WE and /OE) since each /CAS typically controls only a byte width of the data bus.

A single integrated circuit die has both burst mode access and page mode access capabilities. In page mode operation, the equilibrate signal is generated asynchronously in response to column address transitions while /CAS is high. In burst mode, the equilibrate control signal is generated synchronously in response to /CAS transitions which control the generation of burst addresses. A multiplexer is used to direct the input address or the burst address to the address transition detection circuit. Among other benefits, use of the asynchronous address transition detection circuit in the burst mode eliminates the requirement for a synchronous equilibration control signal generation circuit, and minimizes the impact of the burst address path on the optimized asynchronous address path. In operation, at the beginning of a burst access, the initial burst address is fed through the asynchronous address path to the address transition detection circuit to generate an equilibrate signal, then the address path is switched to the burst address generator. At the beginning of each access cycle within the burst access the burst address will generate an equilibrate signal through the address transition detection circuit.

BRIEF DESCRIPTION OF THE DRAWINGS

The features of the invention as well as objects and advantages are best understood by reference to the appended claims, detailed description of particular embodiments and accompanying drawings where:

DETAILED DESCRIPTION OF THE PREFERRED EMBODIMENTS

Figure 1:
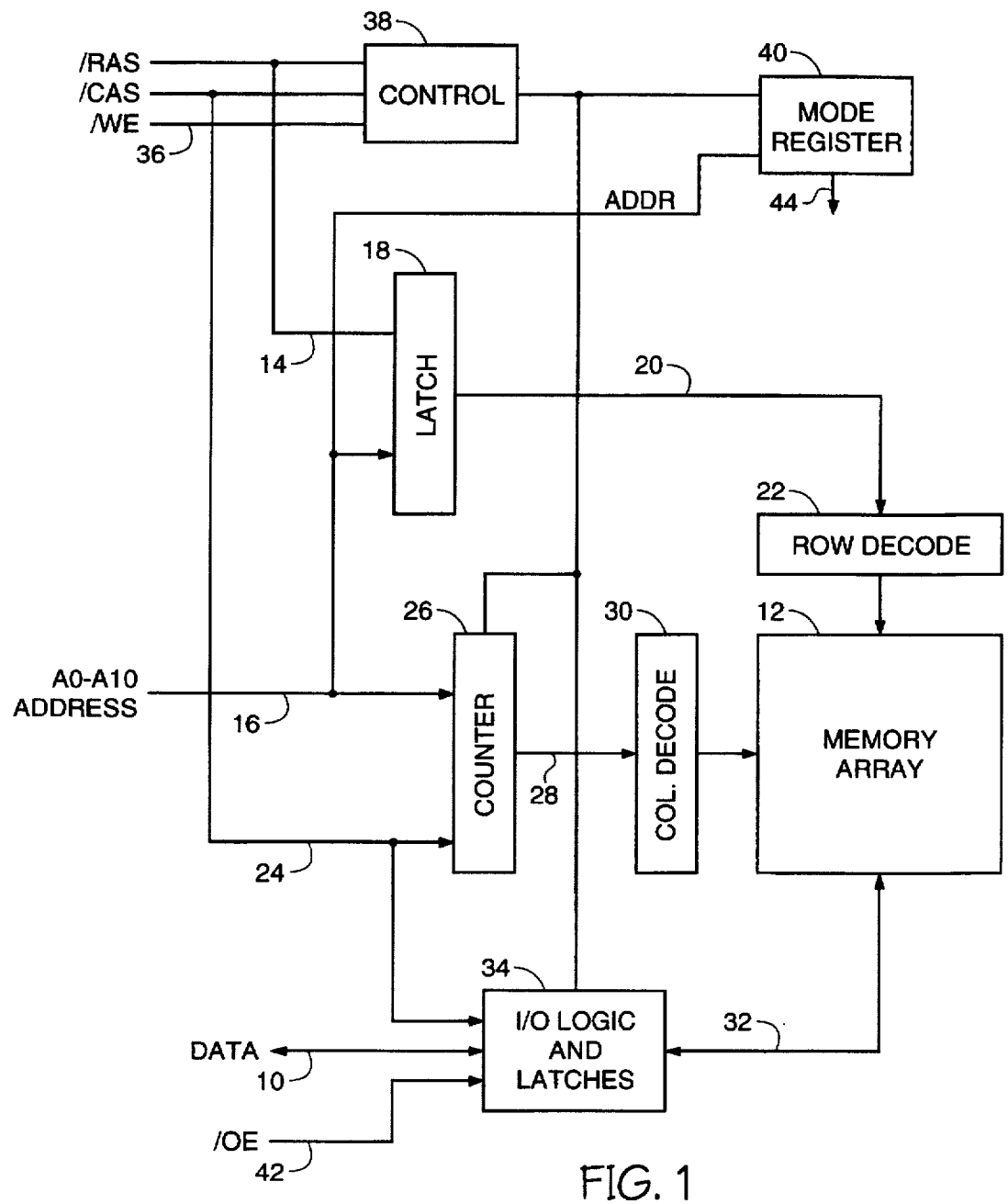
FIG. 1 is an electrical schematic diagram of a memory device in accordance with one embodiment of the invention.

FIG. 1 is a schematic representation of a sixteen megabit device designed in accordance with the present invention. The device is organized as a 2 Meg×8 burst EDO DRAM having an eight bit data input/output path 10 providing data storage for 2,097,152 bytes of information in the memory array 12. The device of FIG. 1 has an industry standard pinout for eight bit wide EDO DRAMs. An active-low row address strobe (/RAS) signal 14 is used to latch a first portion of a multiplexed memory address, from address inputs A0 through A10 16, in latch 18. The latched row address 20 is decoded in row decoder 22. The decoded row address is used to select a row of the memory array 12. A column address strobe (/CAS) signal 24 is used to latch a second portion of a memory address from address inputs 16 into column address counter 26. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches 34. Data 10 driven from the burst EDO DRAM may be latched external to the device in synchronization with /CAS after a predetermined number of /CAS cycle delays (latency). For a two cycle latency design, the first /CAS falling edge is used to latch the initial address for the burst access. The first burst data from the memory is driven from the memory after the second /CAS falling edge, and remains valid through the third /CAS falling edge. Once the memory device begins to output data in a burst read cycle, the output drivers 34 continue to drive the data lines without tri-stating the data outputs during /CAS high intervals dependent on the state of the output enable and write enable (/OE and /WE) control lines, thus allowing additional time for the system to latch the output data. Once a row and a column address are selected, additional transitions of the /CAS signal are used to advance the column address within the column address counter in a predetermined sequence. The time at which data becomes valid at the outputs of the burst EDO DRAM is dependent only on the timing of the /CAS signal provided that /OE is maintained low, and /WE remains high. The output data signal levels may be driven in accordance with, but are not limited to, CMOS, TTL, LVTTL, GTL, or HSTL output level specifications.

The address may be advanced linearly, or in an interleaved fashion for maximum compatibility with the overall system requirements. The column address may be advanced with each /CAS transition, each pulse, or multiple of /CAS pulses in the event that more than one data word is read from the array with each column address. When the address is advanced with each transition of the /CAS signal, data is also driven from the part after each transition following the device latency which is then referenced to each edge of the /CAS signal. This allows for a burst access cycle where the highest switching control line (/CAS) toggles only once (high to low or low to high) for each memory cycle. This is in contrast to standard DRAMs which require /CAS to go low and then high for each cycle, and synchronous DRAMs which require a full clock cycle (high and low transitions) for each memory cycle. For maximum compatibility with existing EDO DRAM devices, the invention will be further described in reference to a device designed to initiate access cycles on falling edges of the /CAS signal. For designs where falling edges of the /CAS signal initiate an access cycle, the falling edge may be said to be the active transition of the /CAS signal.

In the burst access memory device, each new column address from the column address counter is decoded and is used to access additional data within the memory array without the requirement of additional column addresses being specified on the address inputs 16. This burst sequence of data continues for each /CAS falling edge until a predetermined number of data accesses equal to the burst length occurs. A /CAS falling edge received after the last burst address has been generated latches another column address from the address inputs 16 and a new burst sequence begins. Read data is latched and output with each falling edge of /CAS after the first /CAS latency.

For a burst write cycle, data 10 is latched in input data latches 34. Data targeted at the first address specified by the row and column addresses is latched with the /CAS signal when the first column address is latched (write cycle data latency is zero). Other write cycle data latency values are possible; however, for today's memory systems, zero is preferred. Additional input data words for storage at incremented column address locations are latched by /CAS on successive /CAS active transitions. Input data from the input latches 34 is passed along data path 32 to the memory array where it is stored at the location selected by the row and column address decoders. As in the burst read cycle previously described, a predetermined number of burst access writes are performed without the requirement of additional column addresses being provided on the address lines 16. After the predetermined number of burst writes occur, a subsequent /CAS pulse latches a new beginning column address, and another burst read or write access begins.

The memory device of FIG. 1 may include the option of switching between burst EDO and standard EDO modes of operation. In this case, the write enable signal /WE 36 is used at the row address latch time (/RAS falling, /CAS high) to determine whether memory accesses for that row are burst or page mode cycles. If /WE is low when /RAS falls, burst access cycles are selected. If /WE is high at /RAS falling, standard extended data out (EDO) page mode cycles are selected. Both the burst and EDO page mode cycles allow for increased memory device operating frequencies by not requiring the data output drivers 34 to place the data lines 10 in a high impedance state between data read cycles while /RAS is low. DRAM control circuitry 38, in addition to performing standard DRAM control functions, controls the I/O circuitry 34 and the column address counter/latch 26 in accordance with the mode selected by /WE when /RAS falls. In a burst mode only DRAM, or in a device designed with an alternate method of switching between burst and non-burst access cycles, the state of /WE when /RAS falls may be used to switch between other possible modes of operation such as interleaved versus linear addressing modes.

The write enable signal is used in burst access cycles to select read or write burst accesses when the initial column address for a burst cycle is latched by /CAS. /WE low at the column address latch time selects a burst write access. /WE high at the column address latch time selects a burst read access. The level of the /WE signal must remain high for read and low for write burst accesses throughout the burst access. A low to high transition within a burst write access terminates the burst access, preventing further writes from occurring. A high to low transition on /WE within a burst read access likewise terminates the burst read access and places the data output 10 in a high impedance state. Transitions of the /WE signal may be locked out during critical timing periods within an access cycle in order to reduce the possibility of triggering a false write cycle, and/or to guarantee the completion of a write cycle once it has begun. After the critical timing period the state of /WE determines whether a burst access continues, is initiated, or is terminated. Termination of a burst access places the DRAM in a state to receive another burst access command. Both /RAS and /CAS going high during a burst access also terminates the burst access cycle placing the data drivers in a high impedance output state. Read data may remain valid at the device outputs if /RAS alone goes high while /CAS is active for compatibility with hidden refresh cycles, otherwise /RAS high alone may be used to terminate a burst access. A minimum write enable pulse width is only required when it is desired to terminate a burst read and then begin another burst read, or terminate a burst write prior to performing another burst write with a minimum delay between burst accesses. In the case of burst reads, /WE transitions from high to low to terminate a first burst read, and then /WE transitions back high prior to the next falling edge of /CAS in order to specify a new burst read cycle. For burst writes, /WE transitions high to terminate a current burst write access, then back low prior to the next falling edge of /CAS to initiate another burst write access. A minimum /WE pulse width may be specified to guarantee recognition of the /WE pulse despite /WE lockout periods. If no /WE lockout circuit is used, termination of a burst access may be edge sensitive to the /WE signal.

A basic implementation of the device of FIG. 1 may include a fixed burst length of 4, a fixed /CAS latency of 2 and a fixed interleaved sequence of burst addresses. This basic implementation requires very little additional circuitry to the standard EDO page mode DRAM, and may be mass produced to provide the functions of both the standard EDO page mode and burst EDO DRAMs. This device also allows for the output enable pin (/OE) to be grounded for compatibility with many SIMM module designs. When not disabled (tied to ground), /OE is an asynchronous control which prevents data from being driven from the part in a read cycle if it is inactive (high) prior to /CAS falling and remains inactive beyond /CAS rising. If these setup and hold conditions are not met, then the read data may be driven for a portion of the read cycle. It is possible to synchronize the /OE signal with /CAS, however this typically increases the /CAS to data valid delay time and doesn't allow for the last output data to be disabled prior to /RAS high without an additional /CAS low pulse which would otherwise be unnecessary. In a preferred embodiment, if /OE transitions high at any time during a read cycle the outputs remain in a high impedance state until the next falling edge of /CAS despite further transitions of the /OE signal.

Programmability of the burst length, /CAS latency and address sequences may be accomplished through the use of a mode register 40 which latches the state of one or more of the address input signals 16 or data signals 10 upon receipt of a write-/CAS-before-/RAS (WCBR) programming cycle. In such a device, outputs 44 from the mode register control the required circuits on the DRAM. Burst length options of 2, 4, 8 and full page as well as /CAS latencies of 1, 2 and 3 may be provided. Other burst length and latency options may be provided as the operating speeds of the device increase, and computer architectures evolve. The device of FIG. 1 includes programmability of the address sequence by latching the state of the least significant address bit during a WCBR cycle. The burst length and /CAS latency for this particular embodiment are fixed. Other possible alterations in the feature sets of this DRAM include having a fixed burst mode only, selecting between standard fast page mode (non-EDO) and burst mode, and using the output enable pin (/OE) 42 in combination with /RAS to select between modes of operation. Also, a WCBR refresh cycle could be used to select the mode of operation rather than a control signal in combination with /RAS. A more complex memory device may provide additional modes of operation such as switching between fast page mode, EDO page mode, static column mode and burst operation through the use of various combinations of /WE and /OE at /RAS falling time. One mode from a similar set of modes may be selected through the use of a WCBR cycle using multiple address or data lines to encode the desired mode. Alternately, a device with multiple modes of operation may have wire bond locations, or programmable fuses which may be used to program the mode of operation of the device.

A preferred embodiment of a sixteen bit wide burst EDO mode DRAM designed in accordance with the teachings of this invention has two column address strobe input pins /CASH and /CASL. For read cycles only one /CAS signal needs to toggle. The second /CAS may remain high or toggle with the other /CAS. During burst read cycles, all sixteen data bits will be driven out of part during a read cycle even if one /CAS remains inactive. In a typical system application, a microprocessor reads all data bits on a data bus in each read cycle, but may only write certain bytes of data in a write cycle. Allowing one of the /CAS control signals to remain static during read cycles helps to reduce overall power consumption and noise within the system. For burst write access cycles, each of the /CAS signals (CASH and /CASL) acts as a write enable for an eight bit width of the data. The two /CAS's are combined in an AND function to provide a single internal /CAS which will go low when the first external /CAS falls, and returns high after the last external /CAS goes high. All sixteen data inputs are latched when the first of the /CAS signals transitions low. If only one /CAS signal transitions low, then the eight bits of data associated with the /CAS that remained high are not stored in the memory.

The present invention has been described with reference to several preferred embodiments. Just as fast page mode DRAMs and EDO DRAMs are available in numerous configurations including x1, x4, x8 and x16 data widths, and 1 Megabit, 4 Megabit, 16 Megabit and 64 Megabit densities; the memory device of the present invention may take the form of many different memory organizations. It is believed that one who is skilled in the art of integrated circuit memory design can, with the aide of this specification design a variety of memory devices which do not depart from the spirit of this invention. It is therefore believed that detailed descriptions of the various memory device organizations applicable to this invention are not necessary.

It should be noted that the pinout for this new burst EDO memory device may be identical to the pinout for a standard EDO DRAM. The common pinout allows this new device to be used in existing memory designs with minimum design changes. The common pinout also allows for ease of new designs by those of skill in the art who are familiar with the standard EDO DRAM pinout. Variations of the described invention which maintain the standard EDO DRAM pinout include driving the /CAS pin with a system clock signal to synchronize data access of the memory device with the system clock. For this embodiment, it may be desirable to use the first /CAS active edge after /RAS falls to latch the row address, a later edge may be used to latch the first column address of a burst access cycle. After row and column addresses are latched within the device, the address may be incremented internally to provide burst access cycles in synchronization with the system clock. Other pin function alternatives include driving the burst address incrementing signal on the /OE pin since the part does not require a data output disable function on this pin. Other alternate uses of the /OE pin also allow the device to maintain the standard EDO pinout, but provide increased functionality such as burst mode access. The /OE pin may be used to signal the presence of a valid column starting address, or to terminate a burst access. Each of these embodiments provides for a high speed burst access memory device which may be used in current memory systems with a minimum amount of redesign.

Figure 2:
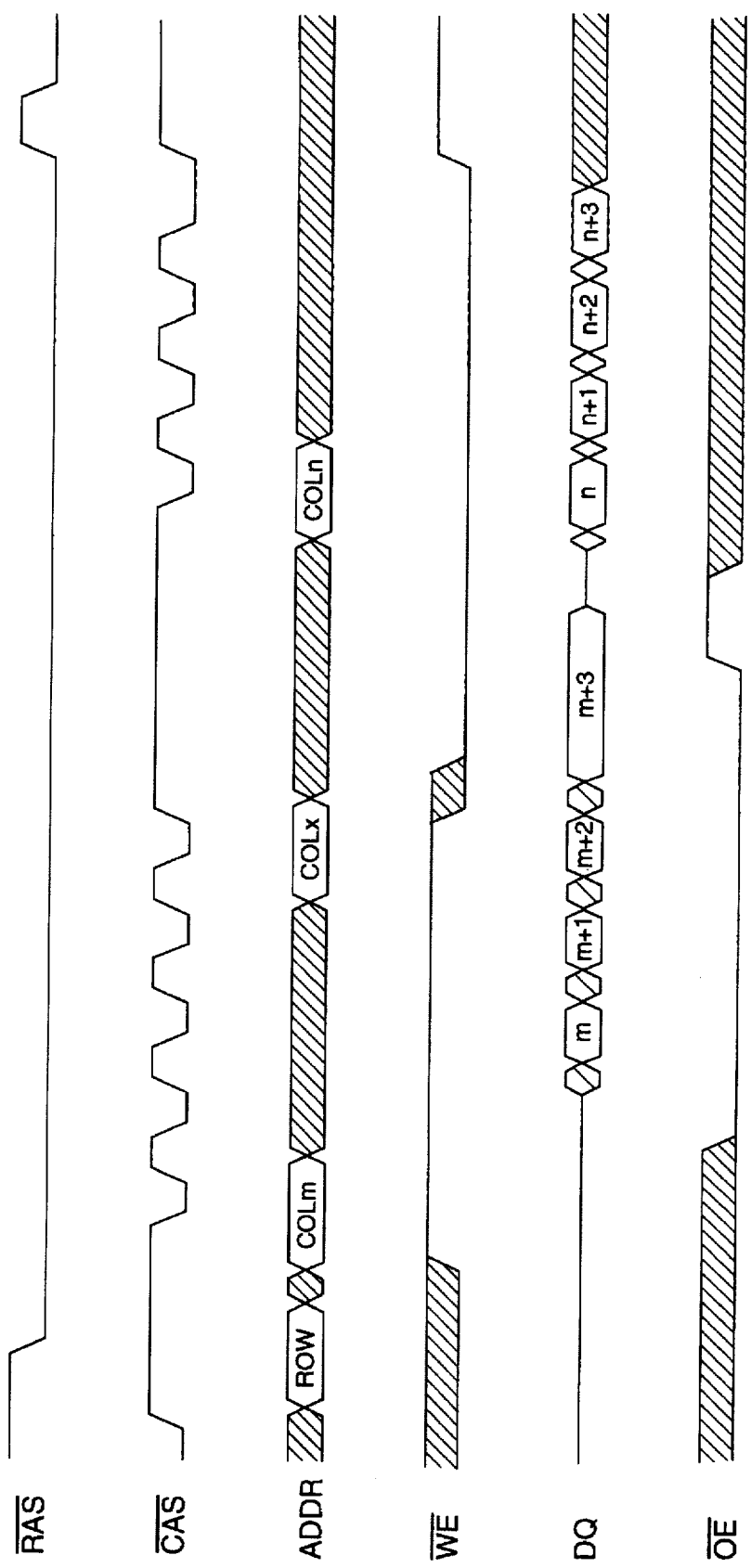
FIG. 2 is a timing diagram for a method of accessing the device of FIG. 1.

FIG. 2 is a timing diagram for performing a burst read followed by a burst write of the device of FIG. 1. In FIG. 2, a row address is latched by the /RAS signal. /WE is low when /RAS falls for an embodiment of the design where the state of the /WE pin is used to specify a burst access cycle at /RAS time, otherwise /WE may be a "don't care" when /RAS falls. Next, /CAS is driven low with /WE high to initiate a burst read access, and the initial column address is latched. The data out signals (DQ's) are not driven in the first /CAS cycle. On the second falling edge of the /CAS signal the internal address generation circuitry provides a column address, and another access of the array begins. The first data out is driven from the device following the second /CAS and a /CAS to data access time (tCAC) delay. Additional burst access cycles continue, for a device with a specified burst length of four, until the fifth falling edge of /CAS which latches a new column address for a new burst read access. /WE falling in the fifth /CAS cycle terminates the burst access, and initializes the device for additional burst accesses. The sixth falling edge of /CAS with /WE low is used to latch a new burst address, latch input data and begin a burst write access of the device. Additional data values are latched on successive /CAS falling edges until /RAS rises to terminate the burst access.

It should be noted from FIG. 2 that for burst read cycles the data remains valid on the device outputs as long as the /OE pin is low, except for brief periods of data transition. Also, since the /WE pin is low prior to or when /CAS falls, the data input/output lines are not driven from the part during write cycles, and the /OE pin is a "don't care". Only the /CAS signal and the data signals toggle at relatively high frequency, and no control signals other than /CAS are required to be in an active or inactive state for one /CAS cycle time or less. This is in contrast to SDRAMs which often require row address strobes, column address strobes, data mask, and read/write control signals to be valid for one clock cycle or less for various device functions. Typical page mode DRAMs also allow for the column address to propagate through to the array to begin a data access prior to /CAS falling. This is done to provide fast data access from /CAS falling if the address has been valid for a sufficient period of time prior to /CAS falling for the data to have been accessed from the array. In these designs an address transition detection circuit is used to restart the memory access if the column address changes prior to /CAS falling. In a preferred embodiment of the design, the address counter is advanced on /CAS rising edges, and the address generated in the counter is then presented to the array on the next /CAS falling edge when the device is in a burst access mode.

Figure 3:
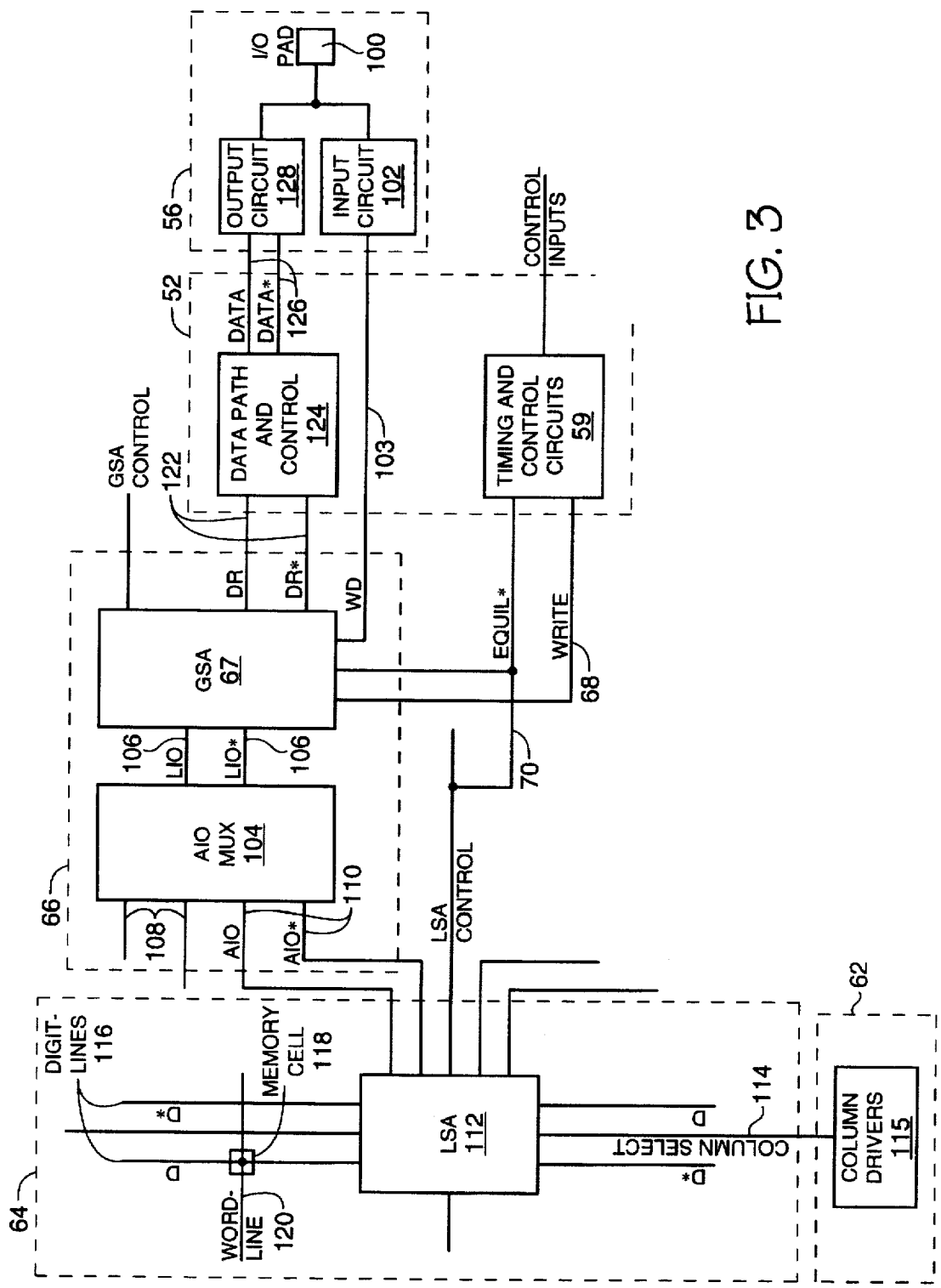
FIG. 3 is block level schematic of a data path portion of the device of FIG. 1.

FIG. 3 is block level schematic of a data path portion of the device of FIG. 1. In FIG. 3, data written to the memory device is received on data I/O pad 100. The write data is passed through input circuit 102 to a global sense amp 66 over write data lines 103. For this example, the sense amplifier includes an I/O line multiplexer 104 which is used to select a path from local I/O data line pair 106 to one of two pairs of array I/O lines 108 and 110. Write data is driven from write data lines 103 to I/O lines 106 when enabled by a logical combination of the equilibrate signal 70 and the write enable signal 68 from timing circuit 59 and data path control circuit 124 of central logic circuitry 52. In this example array I/O lines 108 are coupled to an adjacent section of the array (not shown). Array I/O lines 110 are true and compliment lines coupled to a local array sense amplifier 112 which is part of array section 64. Column select signal 114 from column driver 115 couples array data I/O lines 110 to a pair of complimentary digit lines 116 inside the local sense amplifier 112. One of the complimentary digit lines is coupled to a memory cell 118 through an access device which is selected by a signal on word line 120 from a row address decoder.

Read data follows the same path from the memory cell to the global sense amp where it is then driven on complimentary data read lines 122 to complimentary data lines 126 under control of data path control logic 124 and timing circuits 59. Output circuit 128 drives data from the memory device in accordance with the mode of operation (burst EDO mode, EDO mode, fast Page Mode, etc.).

This specific embodiment is not intended to provide an exhaustive description of all forms of the present invention. For example, I/O line multiplexer 104 would not be necessary if there is a global sense amp 67 for each pair of array I/O lines. Alternatively, additional array I/O lines could be multiplexed through the multiplexer 104 to allow for even fewer global sense amplifiers. Another variation is to allow read and write data to share a common path between the global sense amplifiers and the I/O pad. Also, separate input and output data pins can be provided. Numerous additional variations are possible and will be recognized by one of skill in the art.

Figure 4:
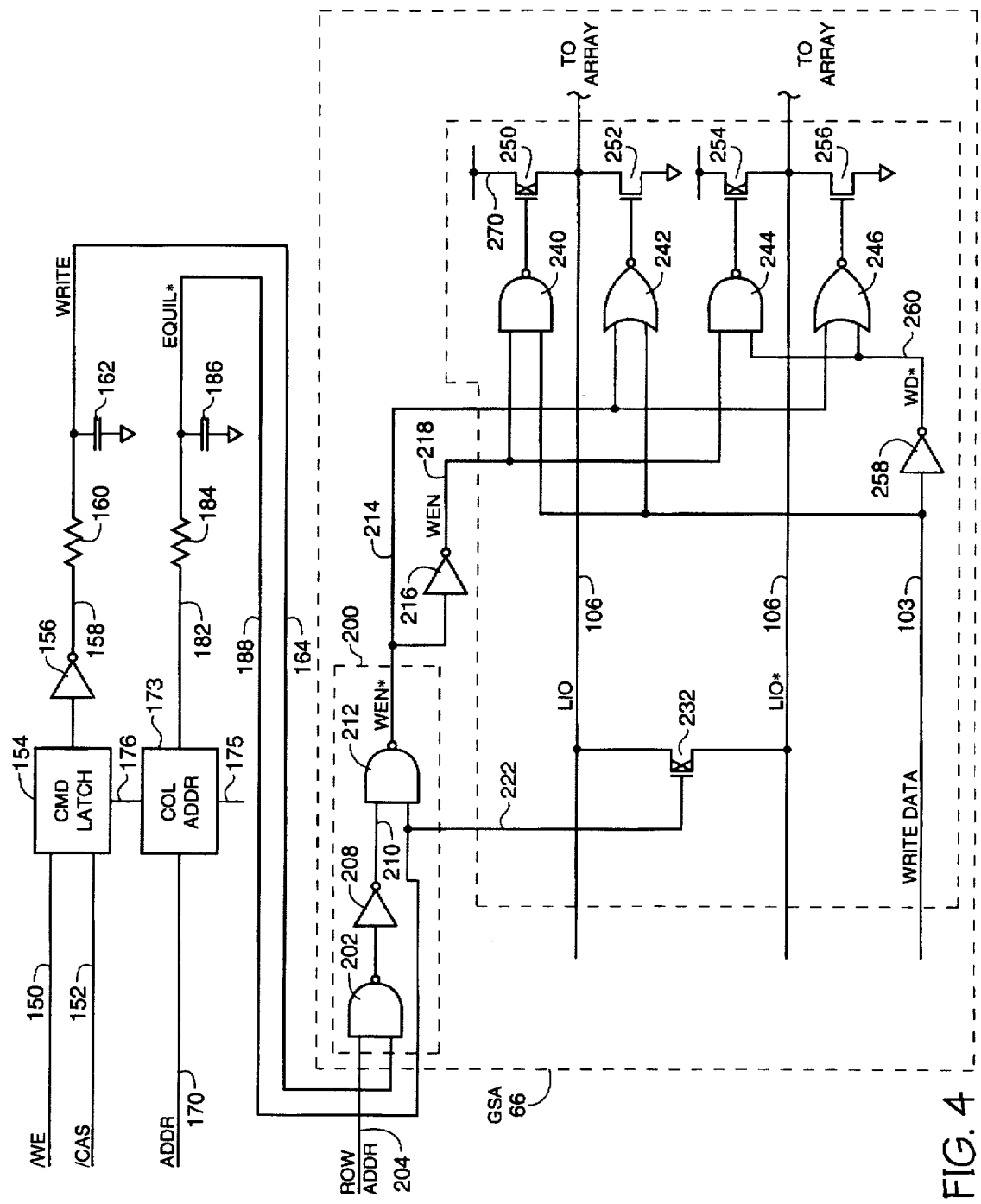
FIG. 4 is a more detailed schematic of a portion of the circuitry of FIG. 3.

FIG. 4 is a schematic diagram providing additional detail for portions of the circuitry of FIG. 3. In FIG. 4, /WE and /CAS are logically combined in command latch and control circuit 154. The write command output of circuit 154 is buffered through driver 156 to write command signal line 158. The write command is coupled to a plurality of sense amps 66 through a distributed line resistance represented by resistor 160 over a signal line with distributed capacitive load represented by capacitor 162. Write signal 164 arriving at the sense amplifier will be a delayed version of the output of the write command from the command latch.

Address inputs 170 are coupled to burst address generator 173 which provides a column address 175 to the memory array. The column address and a version of the write command 176 are used to generate an equilibrate signal 182. Equilibration control signal 182 passes through distributed resistance 184, and is loaded by distributed capacitance 186. A delayed version of the equilibrate signal 188 is coupled to the sense amp 66. Local write driver enable circuit 200 allows write cycle data 103 to be driven for a maximum write cycle time by disabling the write data drivers 240-256 during equilibration of the complimentary data I/O lines 106. The data I/O lines are equilibrated when equilibration device 232 couples the true and compliment lines together in response to the equilibration control signal 222.

For a maximized data write cycle time, the write command 164 can remain active throughout a burst write access. In this case, the write drivers are enabled and disabled by the equilibrate signal which will occur at the beginning of each access cycle. For nonburst mode operation, it is beneficial to provide the write command prior to the end of the equilibrate function to allow the write to begin as soon as possible. For these devices, the write will typically end prior to the next /CAS falling edge to allow the device to meet the column address to data valid access time in (TAA). For EDO devices in particular, the page mode cycle time is very short, but the address access time begins while /CAS is high, so the write cycles should end as soon as possible. One way to allow the write cycle to end as soon as possible is to begin it immediately after the equilibrate is complete.

It is important to note that devices 250 and 256 will generally be enabled simultaneously, as will devices 252 and 254. If the enable gate 212 were not locally present, then the write enable signal would need to be delayed from the equilibrate disable time to guarantee that a current path through devices 250, 232 and 256 or devices 252, 232 and 254 does not exist.

Figure 5:
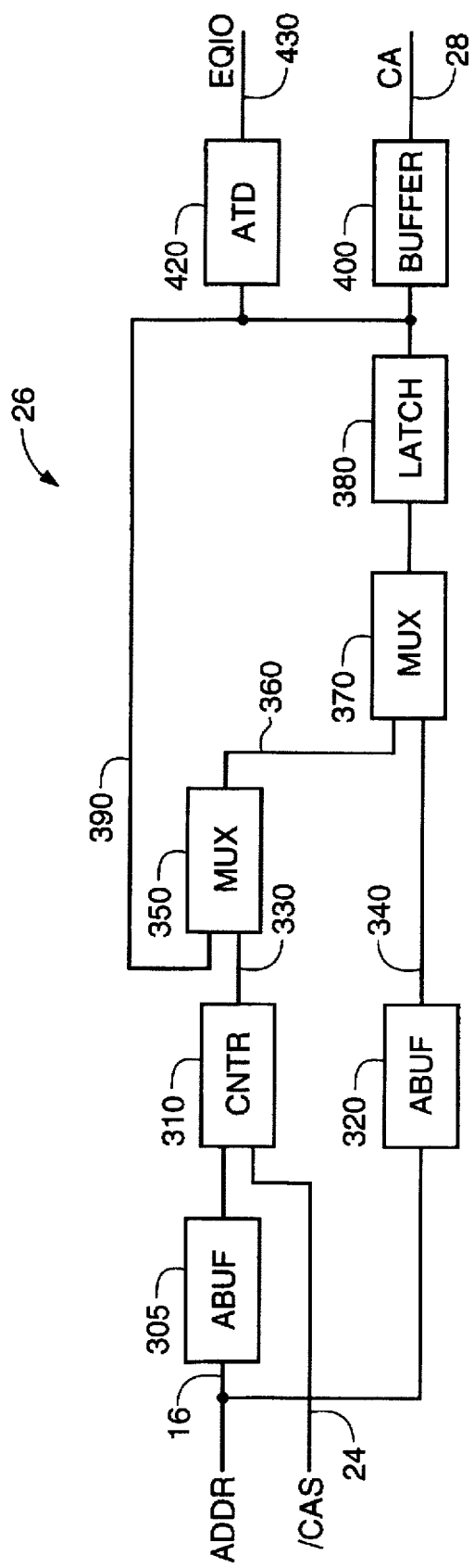
FIG. 5 is schematic diagram of a portion of the column address path of the device of FIG. 1.

FIG. 5 is a schematic diagram of a portion of the column address path of the device of FIG. 1 shown generally as block 26. In FIG. 5 address 16 is coupled to address buffers 305 and 320 which may be located within block 26 of FIG.

1 or at a remote location of the integrated circuit (near address input pads for example). The output of address buffer 305 is coupled to burst address generator 310. Burst address 330 from the burst address generator is coupled to multiplexer 370 through multiplexer 350 and address lines 360. Multiplexer 370 selects either the buffered address 340 from address buffer 320 or the burst address 360 to be latched in latch 380. Latched column address 390 is coupled to a column address buffer 400 which drives the column address to the column address decoder 30 of FIG. 1 to select a column of the memory array. The output of latch 380 is also coupled to an asynchronous address transition detection circuit 420 which generates an equilibration control signal 430 at the beginning of each memory access in response to detected changes in the column address 390. Latched address 390 is also fed back to multiplexer 350. In page mode operation, the multiplexer 370 selects the address from the address buffer 320, and the output of the burst address generator 310 is ignored.

In burst mode, the initial burst address is passed to the latch 370 from the address buffer 340 in response to the first falling /CAS transition. The multiplexer 370 will select the address from address lines 360 for subsequent column addresses within the burst access. The address generator 310 may advance the burst address on rising edges of /CAS. Multiplexer 350 will select the burst address from counter 310 in response to subsequent /CAS falling edges. After an address is latched, the multiplexers 350 and 370 select the address feedback path from 390 through 350, 360 and 370 until the next address is required. This allows the burst address generator to advance on each /CAS rising edge of the burst access.

In an alternate embodiment, the two multiplexers 350 and 370 may be combined into a single multiplexer to select the address from 330, 340 or 390. Another alternative embodiment eliminates the feedback path from address lines 390 to multiplexer 350 while providing additional control of latch 380 to latch the burst address except for a brief period of time after /CAS falls when a new burst address is allowed to pass through.

Figure 6:
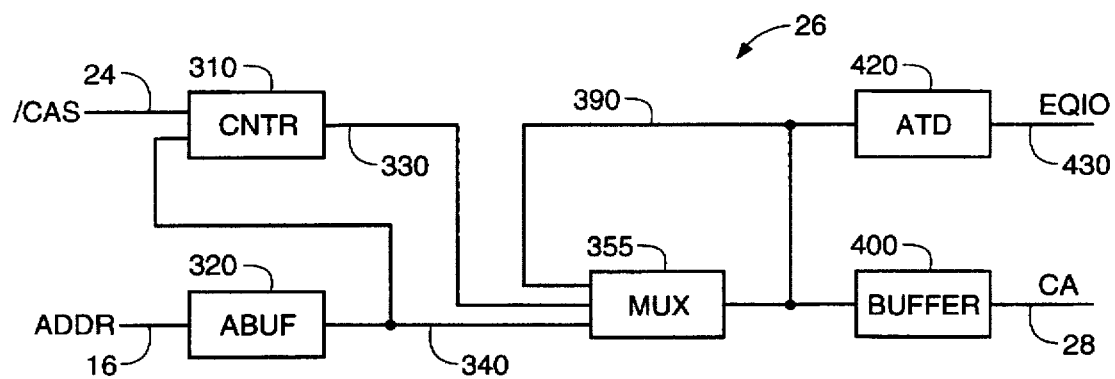
FIG. 6 is an alternate schematic diagram of a portion of the column address path of the device of FIG. 1.

FIG. 6 is an alternate embodiment of the portion of the address path shown in FIG. 5. In FIG. 6, elements which have common functions with those of FIG. 5 have been given corresponding reference numbers. In FIG. 6, a single set of address buffers 320 are coupled to the address counter 310 and multiplexer 355. The latch 380 of FIG. 5 is no longer present, and multiplexers 350 and 370 of FIG. 5 have been combined into a single multiplexer 355. In page mode operation, the multiplexer 355 selects address lines 340 from the address buffer 320 while /CAS is high. This provides an asynchronous address path from the address buffer to the address transition detection circuit 420 so that the equilibration control signal 430 can be generated for each column address transition while /CAS is high. When /CAS falls, the multiplexer 355 selects feedback path 390 to effectively latch the column address. In burst mode, the initial burst address is passed through the multiplexer 355 in response to the first /CAS falling edge. The initial address is then latched by selecting feedback path 390. The initial address is also loaded into address generator 310 where it may be advanced on rising edges of /CAS. For each subsequent falling edge of /CAS within a burst access, the multiplexer will select lines 330 to provide the next burst address to buffer 400 and address transition detection circuit 420. Then address path 390 is again selected to latch the address which allows the address generator to again advance on the next rising edge of /CAS without disturbing the latched column address 390.

Variations on this embodiment which fall within the scope of the present invention include elimination of the feedback path 390 to the multiplexer in combination with the addition of an address latch between the address buffer 320 and the multiplexer. In this configuration, the latch will store the column address while /CAS is low in page mode, and the address generator will increment in response to falling edges of /CAS eliminating the requirement for a burst address latch or feedback path. The multiplexer may then simply select between a burst address path and a page mode address path. If the address generator is designed to pass the initial burst address from input address 16 through to address lines 330 for each new burst access, then the multiplexer select will only need to be changed when the part is switched between page mode and burst mode.

Figure 7:
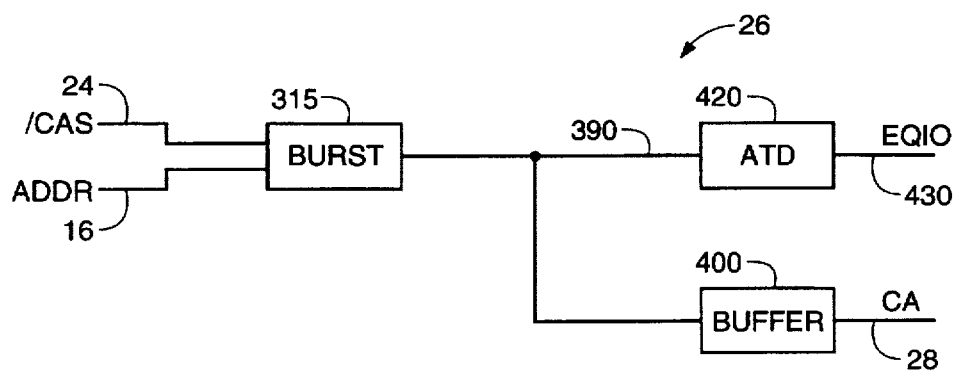
FIG. 7 is another alternate schematic diagram of a portion of the column address path of the device of FIG. 1.

FIG. 7 is yet another embodiment of the portion of the address path shown in FIG. 5. In FIG. 7, input address 16 feeds page mode and burst mode address generator 315. In page mode operation, the input address is passed through address generator 315 while /CAS is high, and is latched within address generator while /CAS is low. In burst mode, an initial burst address is passed through the address generator in response to the first /CAS low of the burst access. Subsequent burst addresses are generated within the address generator and passed to address lines 390 on successive /CAS falling edges. Address generator 315 may comprise a counter which advances the burst address on rising /CAS edges, and a latch which drives the burst addresses to lines 390 in response to /CAS falling edges.

Figure 8:
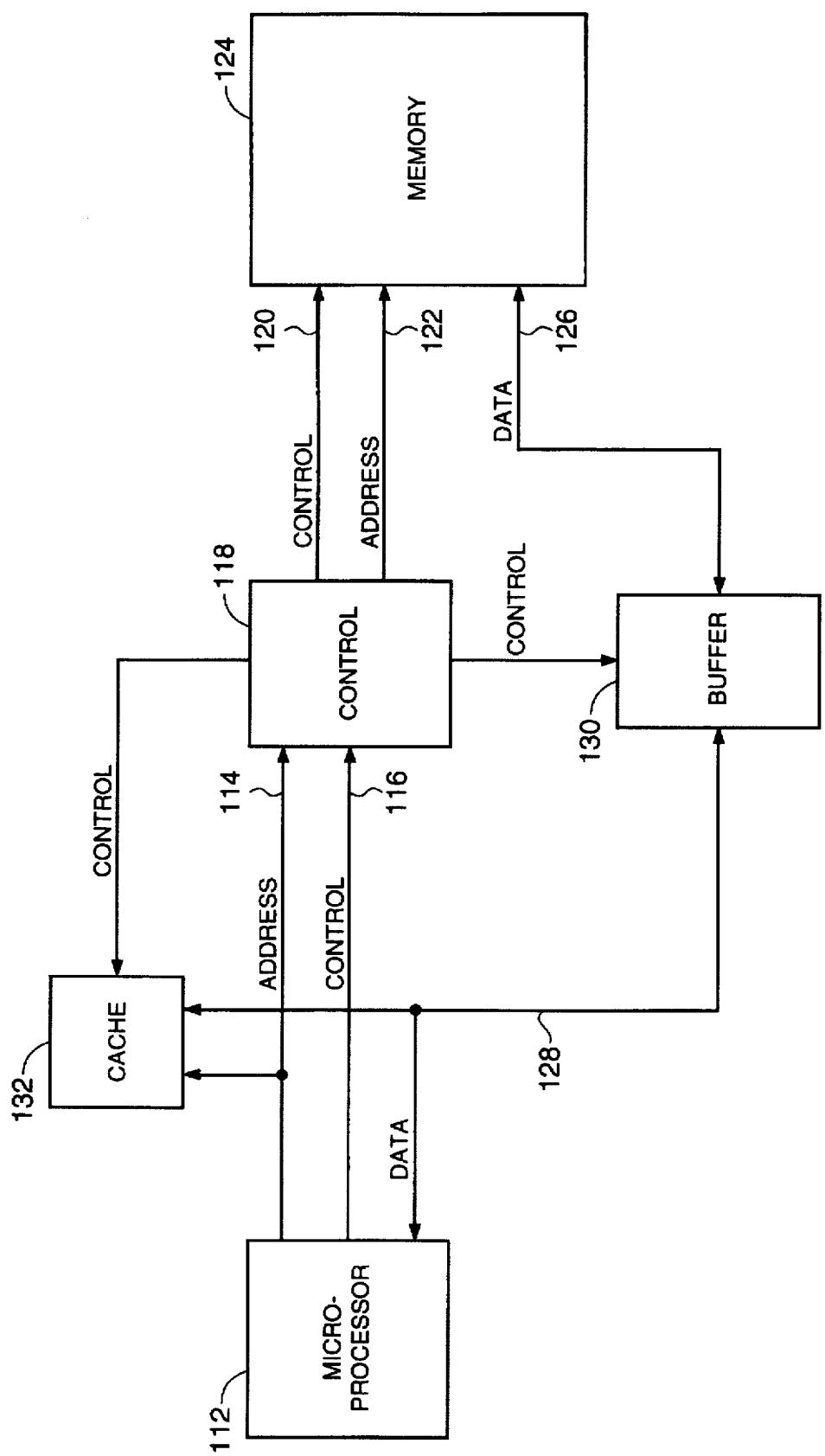
FIG. 8 is a schematic diagram of a computer system designed in accordance with the teachings of the present invention.

FIG. 8 is a schematic representation of a data processing apparatus designed in accordance with the present invention. For the purposes of this specification a microprocessor may be, but is not limited to, a central processing unit (CPU), a microprocessor, a microcontroller, a digital signal processor, or an arithmetic processor. In FIG. 8, microprocessor 112 is connected via address lines 114 and control lines 116 to a memory control circuit 118. The memory control circuit provides address and control signals on lines 122 and 120 respectively to a burst access memory device 124. The burst access memory device sends and receives data over data bus 126. Optional data bus buffer 130 between memory data bus 126 and microprocessor data bus 128 allows for amplification of the data signals, and/or synchronization with the microprocessor and memory control signals. A fast static random access memory (SRAM) cache circuit 132 is also optional and provides higher speed access to data stored in the cache from the memory circuit or the microprocessor. Memory control circuit 118 may be incorporated within the microprocessor. The memory control circuit provides the required address strobe signals and read/write control signals required for burst mode access of the memory circuit. By providing burst access of the memory by the processor, a computer with relatively high memory bandwidth can be designed without the requirement of a fast SRAM cache. SRAMs which are fast enough to provide memory access without wait states can significantly add to the cost of a computer. Thus the burst access memory device of the present invention allows for medium to high performance computers to be manufactured at a cost which is significantly less than those manufactured today. Use of the burst access memory device of the present invention in cooperation with a fast SRAM cache allows for an even higher performance computer design by providing fast access to main memory in the event of a cache miss.

In a burst write operation, the processor 112 provides an initial address and a write command to the memory controller. The memory controller provides a row address to the memory with a row address strobe. The memory controller then provides a write command, a column address and a column address strobe to the memory. The memory will equilibrate internal data I/O lines in response to receipt of the write command and column address. During the equilibrate operation, write data and write command signals are passed to global sense amplifiers within the burst access memory device. At the end of the equilibrate operation, write data drivers are enabled, and write data is stored in the memory array. In a preferred embodiment, positive (low to high) transitions of /CAS will cause an internal address counter of the memory device to advance to the next burst address. Negative (high to low) transitions of /CAS will then end the previous write cycle, and pass the burst address to the address transition detection circuit which will generate an equilibrate signal to equilibrate the I/O lines. The negative transition of /CAS will also allow the burst address from the counter to select a column of the array. Once the equilibration is complete, the next write will be performed at the burst address from the counter. In an alternate embodiment, a clock signal is input to a burst access device to control generation of a burst address from the counter (SDRAMs for example have a clock input pin).

In a burst read operation, the processor 112 provides an initial address and a read command to the memory controller. The memory controller provides a row address to the memory with a row address strobe. The memory controller then provides a read command, a column address and a column address strobe to the memory. The memory will equilibrate internal data I/O lines in response to receipt of the read command and column address. At the end of the equilibrate operation, data from the specified column of the array will be amplified and driven on the data I/O lines to the output buffer. In a preferred embodiment, positive (low to high) transitions of /CAS will cause an internal address counter of the memory device to is advance to the next burst address. Negative (high to low) transitions of /CAS will then allow the burst address to pass to the address transition detection circuit which will generate an equilibrate signal to equilibrate the I/O lines. The negative transition of /CAS will also allow the burst address from the counter to select a column of the array. Once the equilibration is complete, the next read will be performed at the burst address from the counter. In an alternate embodiment, a clock signal is input to a burst access device to control generation of the burst address within the memory device.

Memory 124 may also operate in a page mode such as Fast Page Mode or EDO mode. Write commands at memory sense amps are enabled by the equilibrate signal becoming inactive at the sense amp. Using the equilibrate signal at the sense amp to gate the write signal to enable the write drivers eliminates wasted time associated with delaying the write driver enable signal to prevent excessive currents from flowing through the write drivers during the equilibration operation. In page mode, the column address is allowed to flow from the microprocessor asynchronously through to the address transition detection circuit while /CAS is high in order to generate an equilibration signal.

For the purposes of this specification a node may be, but is not limited to, an intersection of conductors, a circuit input or output, or any point along a signal path. For example, the write command may be said to enter the global sense amp at node is 164 and device 250 of FIG. 4 is said to be connected to a power source at node 270. Also, the term signal may refer to but is not limited to information transferred along a conductor, or may refer to the conductor itself. For example, It may be said that the equilibrate signal 188 is coupled to the sense amp 66. In this context, the term signal represents a physical conductor for carrying the electrical information to equilibrate the data I/O lines, and is not limited to the electrical information itself which is not present when the device is not connected to a power source. The term "coupled" refers to but is not limited to a connection which may be made directly, after buffering, or through another element such as a resistor, capacitor, transistor, or logic device. Typically, a device will be responsive at some time to a signal or another device which is coupled to it.

While the present invention has been described with reference to preferred embodiments, numerous modifications and variations of the invention will be apparent to one of skill in the art without departing from the scope of the invention.

What is claimed is:

1. A circuit comprising:

an address buffer providing a first address;

an input adapted to receive an access cycle strobe signal;

a memory array;

an address generator coupled to said address buffer and to said input, said address generator adapted to provide a series of addresses in response to receipt of the first address and receipt of the access cycle strobe signal; and an address transition detection circuit coupled to said address buffer and to said address generator, said address transition detection circuit having an output coupled to said memory array, providing a first equilibration signal to said memory array in response to the first address in a first mode of operation, and said address transition detection circuit providing a second equilibration signal to said memory array in response to each subsequent address of the series of addresses in a second mode of operation.

2. The circuit of claim 1 further comprising:

a mode select circuit coupled to said address generator.

3. The circuit of claim 1 wherein said memory array comprises a plurality of dynamic random access memory elements.

4. The circuit of claim 1 further comprising:

a pair of complimentary data lines coupled to said memory array; and an equilibration circuit coupled to said complimentary data lines, responsive to the first or second equilibration signal to equilibrate said complimentary data lines.

5. A circuit comprising:

a memory array comprising a plurality of rows and a plurality of columns;

a column address generator, operable in a burst mode and a page mode, coupled to said memory array;

a mode select circuit coupled to said column address generator to select the burst mode or the page mode;

an address transition detection circuit coupled to said column address generator;

a pair of complimentary data lines coupled to said memory array; and an equilibration circuit coupled to said complimentary data lines and to said address transition detection circuit.

6. A circuit comprising:

an address generator responsive to a first polarity of transitions of a control signal to provide a series of addresses;

an address latch responsive to a second polarity of transitions of the control signal to latch each of the series of addresses; and an address transition detection circuit responsive to the latched addresses, said address transition detection circuit providing an equilibration control signal.

7. A method of operating a memory device having an address generation circuit, comprising steps of:

receiving an address from a source external to the memory device;

latching the address;

generating a next address in the address generation circuit;

latching the next address;

detecting a difference between the address and the next address; and generating an equilibration signal in response to said step of detecting a difference.

8. A method of supplying data to a microprocessor comprising steps of:

addressing a memory circuit with an address from the microprocessor;

latching the address within the memory circuit;

generating a next address within the memory circuit;

detecting a difference between the address and the next address;

generating an equilibration signal within the memory circuit in response to said step of detecting a difference;

supplying data to the microprocessor from the address of the memory circuit; and supplying data to the microprocessor from the next address of the memory circuit.

* * * * *